(12) United States Patent
Hong et al.

(10) Patent No.: US 8,459,526 B2
(45) Date of Patent: Jun. 11, 2013

(54) METHOD AND APPARATUS FOR FABRICATING VERTICAL DEPOSITION MASK

(75) Inventors: Jong-Won Hong, Suwon-si (KR); Eugene Kang, Suwon-si (KR); Si-Young Park, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1251 days.

(21) Appl. No.: 12/267,442

(22) Filed: Nov. 7, 2008

(65) Prior Publication Data

US 2009/0127236 A1 May 21, 2009

(30) Foreign Application Priority Data

Nov. 20, 2007 (KR) .................. 10-2007-0118787

(51) Int. Cl.
*B23K 37/04* (2006.01)
*B23K 26/00* (2006.01)

(52) U.S. Cl.
USPC .......... 228/39; 228/49.1; 228/49.4; 219/121.6

(58) Field of Classification Search
None
See application file for complete search history.

(56) References Cited

U.S. PATENT DOCUMENTS

| | | | |
|---|---|---|---|
| 4,902,257 A * | 2/1990 | Adler et al. | 445/4 |
| 5,162,008 A * | 11/1992 | Steiner et al. | 445/30 |
| 5,167,558 A * | 12/1992 | Duchek et al. | 445/64 |
| 6,897,164 B2 | 5/2005 | Baude et al. | |
| 2002/0025406 A1 | 2/2002 | Kitazume | |
| 2002/0145375 A1 * | 10/2002 | LaPeruta et al. | 313/402 |
| 2002/0148370 A1 * | 10/2002 | Erdmann | 101/127.1 |
| 2004/0160609 A1 | 8/2004 | Ohsawa et al. | |
| 2004/0163592 A1 * | 8/2004 | Abiko et al. | 118/715 |
| 2005/0098110 A1 * | 5/2005 | Abiko | 118/715 |
| 2005/0192142 A1 * | 9/2005 | Stone et al. | 474/101 |
| 2006/0191864 A1 | 8/2006 | Yotsuya | |
| 2006/0213442 A1 * | 9/2006 | Park et al. | 118/720 |
| 2006/0217023 A1 * | 9/2006 | Park et al. | 445/24 |
| 2007/0190888 A1 | 8/2007 | Griffin et al. | |
| 2007/0190889 A1 * | 8/2007 | Lee et al. | 445/47 |
| 2008/0034991 A1 * | 2/2008 | Nakashima et al. | 101/130 |
| 2011/0020488 A1 * | 1/2011 | Park et al. | 425/383 |
| 2011/0031486 A1 * | 2/2011 | Shigemura et al. | 257/40 |

FOREIGN PATENT DOCUMENTS

| | | |
|---|---|---|
| CN | 1800431 A | 7/2006 |
| EP | 1 209 522 A2 | 5/2002 |
| EP | 1 229 144 A2 | 8/2002 |
| JP | 01-236540 A * | 9/1989 |

(Continued)

OTHER PUBLICATIONS

DERWENT-ACC-No: 2008-E80147 corresponds to KR-2007073093A (published 2008).*

(Continued)

*Primary Examiner* — Kiley Stoner
(74) *Attorney, Agent, or Firm* — Christie, Parker & Hale, LLP

(57) ABSTRACT

A method and apparatus for fabricating a vertical deposition mask capable of welding a mask sheet and a mask frame for preventing a large area mask from drooping due to the weight of the mask. The apparatus includes a tensioning device for tensioning a mask sheet and a welder for attaching a mask frame to a circumference of the mask sheet. The tensioning device includes clamps for supporting the mask sheet and tensioners coupled to the clamps for applying tensile force to the clamps and to evenly fix in place the mask sheet by the clamps.

17 Claims, 12 Drawing Sheets

FOREIGN PATENT DOCUMENTS

| | | | | |
|---|---|---|---|---|
| JP | 2000-306506 A | * | 11/2000 | |
| JP | 2002-069619 | | 3/2002 | |
| JP | 2002-221912 | | 8/2002 | |
| JP | 2002-305080 | | 10/2002 | |
| JP | 2003-141989 | | 5/2003 | |
| JP | 2003-217447 A | * | 7/2003 | |
| JP | 2005-174933 | | 6/2005 | |
| JP | 2005-519187 | | 6/2005 | |
| JP | 2006-111941 | | 4/2006 | |
| JP | 2006-164815 | | 6/2006 | |
| JP | 2006-188746 | | 7/2006 | |
| JP | 2006-188748 | | 7/2006 | |
| JP | 2006-233286 | | 9/2006 | |
| KR | 2002-0053167 | | 7/2002 | |
| KR | 10-2003-0075221 | | 9/2003 | |
| KR | 20-0385699 | | 5/2005 | |
| KR | 10-2005-0055999 | | 6/2005 | |
| KR | 10-2006-0080476 | | 7/2006 | |
| KR | 10-2006-0080479 | | 7/2006 | |
| KR | 10-2006-0123946 | | 12/2006 | |
| KR | 10-2007-0101755 | | 10/2007 | |

OTHER PUBLICATIONS

KIPO Office action dated Sep. 15, 2009, for priority Korean application 10-2007-0118787, noting listed reference in this IDS.

European Search Report dated Jun. 30, 2009, for corresponding European application 08169477.0, noting listed references in this IDS.

Japanese Office action dated Jun. 7, 2011 for corresponding Japanese patent Application No. 2008-141788, 2 pps.

KIPO Office action dated Feb. 24, 2010, for priority Korean Patent application 10-2007-0118787, noting listed reference in this IDS, as well as references previously filed in an IDS dated Apr. 23, 2009 and Dec. 9, 2009.

Office action dated Mar. 17, 2009 for corresponding Korean Patent Application No. 10-2007-0118787 listing cited references.

SIPO Office action dated Nov. 1, 2010, issued in corresponding Chinese Patent Application No. 200810176343.8 (5 sheets), noting listed reference in this IDS, as well as U.S. Publication 2007/0190888 A1, previously filed in an IDS dated Sep. 21, 2009.

* cited by examiner

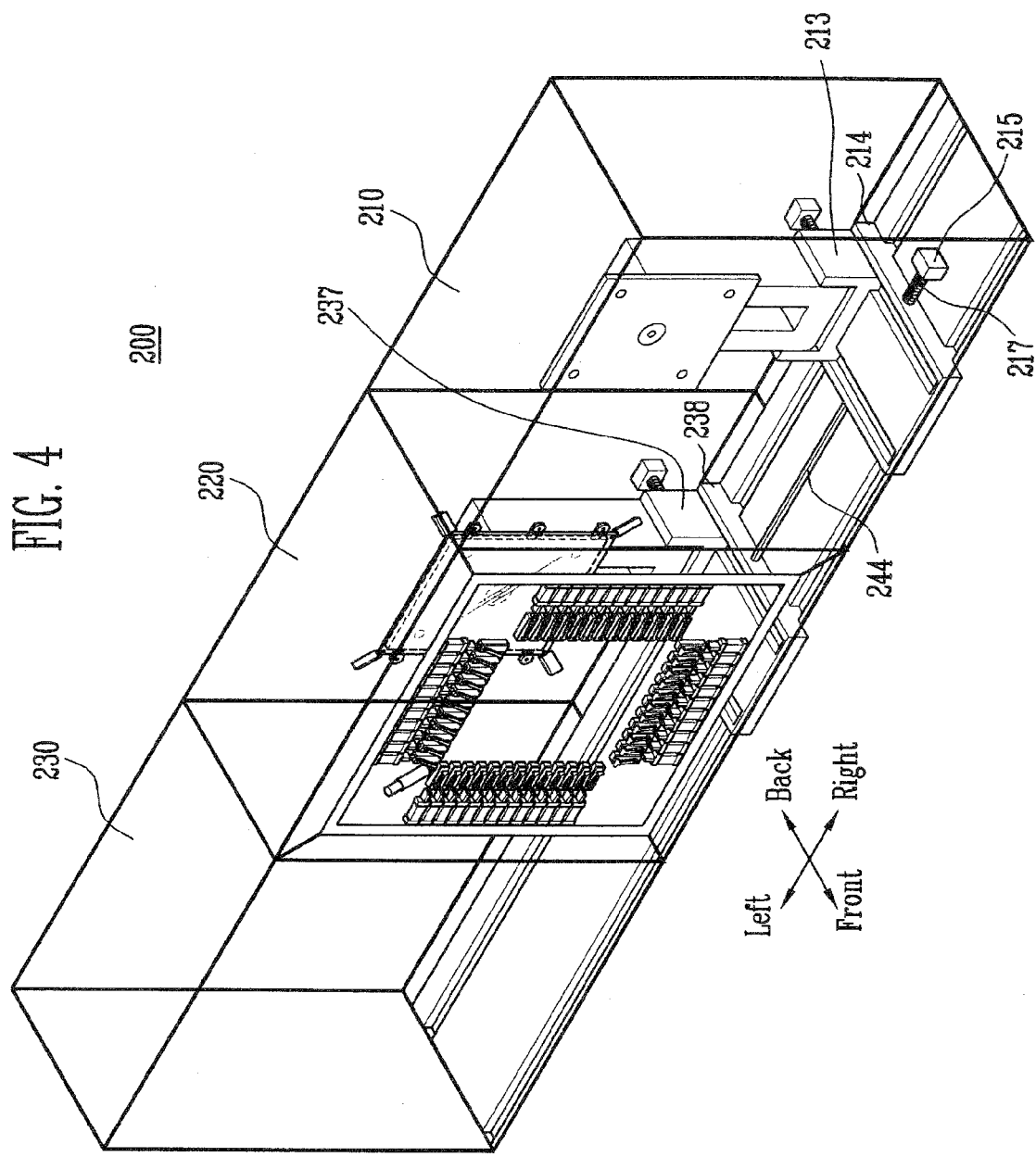

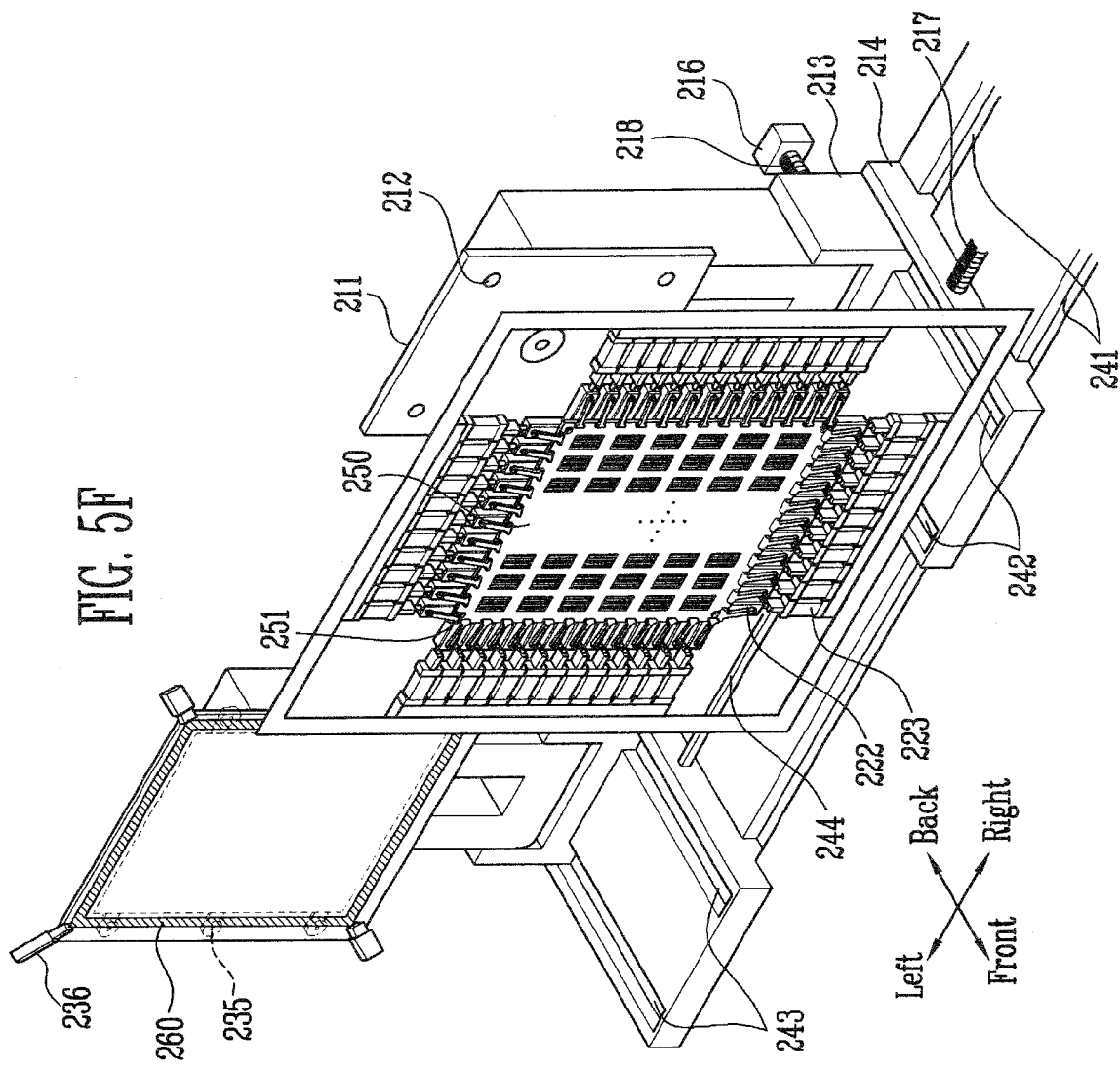

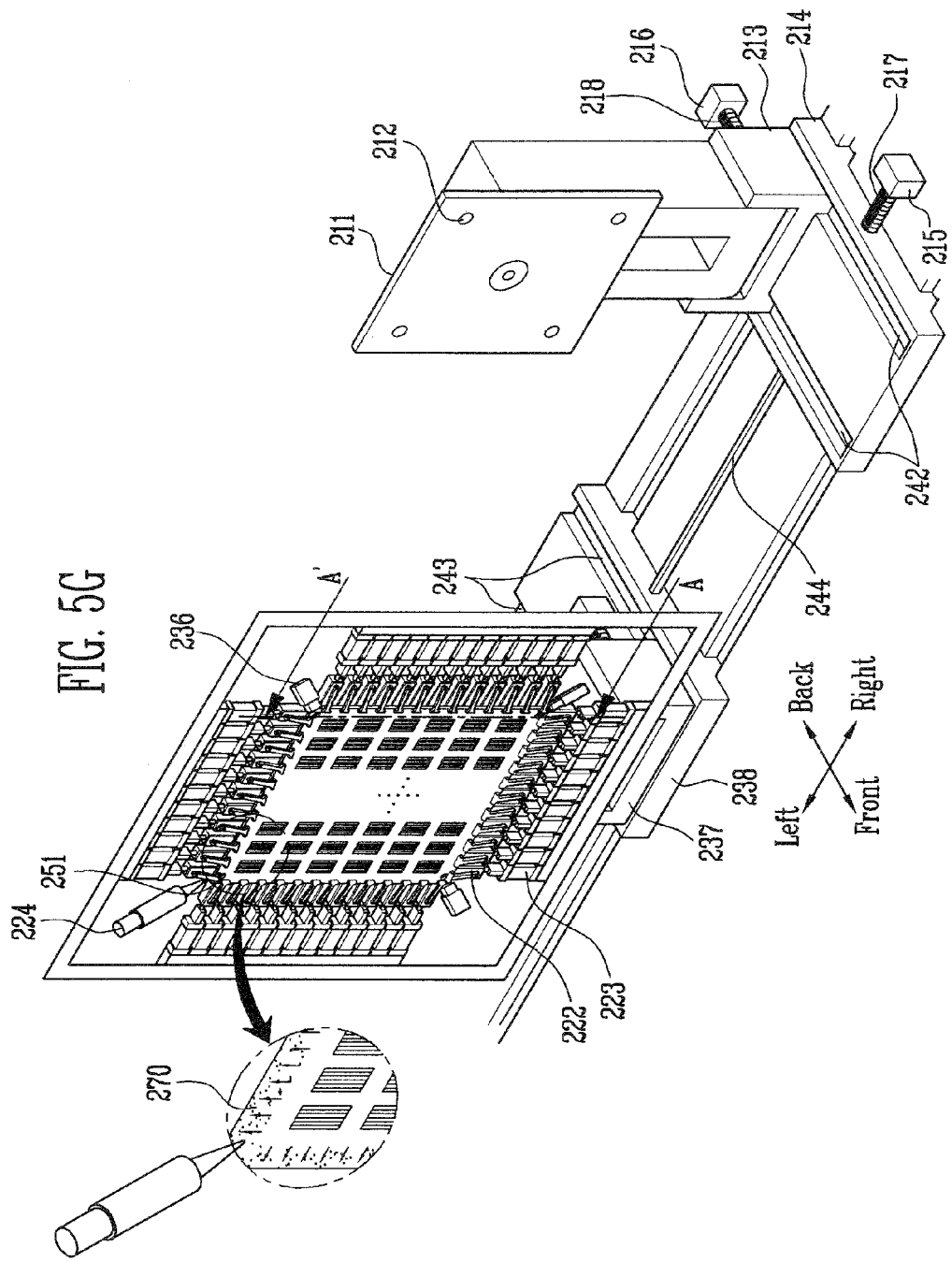

METHOD AND APPARATUS FOR FABRICATING VERTICAL DEPOSITION MASK

CROSS-REFERENCE TO RELATED APPLICATION

This application claims priority to and the benefit of Korean Patent Application No. 10-2007-0118787, filed on Nov. 20, 2007, in the Korean Intellectual Property Office, the entire content of which is incorporated herein by reference.

BACKGROUND OF THE INVENTION

1. Field of the Invention

The present invention relates to vertical deposition masks and their fabrication, and, more particularly, to a method and apparatus for fabricating the vertical deposition mask such that the mask is prevented from drooping.

2. Discussion of the Related Art

In general, a mask is used for depositing a layer having a predetermined pattern when fabricating a light emitting display. That is, when a layer such as an organic layer is deposited, a layer having a pattern corresponding to apertures is formed on a substrate using the mask having apertures in a specific pattern.

The mask is formed of a metal having predetermined strength in order to maintain the shape of the apertures of the specific pattern, and the deposition process is performed after horizontally positioning the substrate on which the mask is provided.

However, the center of the mask can droop due to the weight of the mask and generate an error in the pattern of the layer deposited on the substrate during the deposition process.

Such a problem becomes severe when a large area substrate is deposited since, as the size of the substrate on which deposition is performed increases, the size of the mask corresponding to the size of the substrate also increases so that the center of the mask remarkably droops due to the weight of the mask.

FIG. 1 is a perspective view illustrating a conventionally fabricated mask sheet and a mask to which a mask frame is welded. FIG. 2 illustrates that the drooping of the mask of FIG. 1.

Referring to FIGS. 1 and 2, a mask 10 includes a mask sheet 11 in which apertures of a predetermined pattern are formed and a mask frame 13 for fixing the mask sheet 11.

The mask 10 is fabricated by welding the mask sheet 11 and the mask frame 13 using a mask fabricating apparatus.

That is, the mask fabricating apparatus fixes the edge of the mask sheet 11 by a clamp (not shown), attaches the mask sheet 11 fixed in place by the clamp to the mask frame 13, and the attached region is welded to fabricate the mask.

In the conventional art, the mask fabricating apparatus performs welding after horizontally positioning the mask sheet 11 and the mask frame 13. However, the fabricated mask 10 can droop in a plane direction due to the load of the mask sheet 11 as illustrated in FIG. 2.

Therefore, a welding line between the mask sheet 11 and the mask frame 13 does not form a straight line 14 but forms a curved line 15. As a result, the positions of the apertures 12 formed in the mask sheet 11 are not formed as desired.

As such, a thin film pattern is not uniformly formed on the substrate using the mask 10 and the position of the thin film formed on the substrate is not formed in the desired position on the substrate.

SUMMARY OF THE INVENTION

In accordance with the present invention an apparatus is provided for fabricating a vertical deposition mask, the apparatus being capable of providing welding a mask sheet and a mask frame to be vertical to a plane. The apparatus prevents a large area mask from drooping due to the weight of the mask when the mask corresponding to a substrate is fabricated, particularly when the area of the substrate on which deposition is performed increases.

A method of fabricating a vertical deposition mask using the apparatus is also provided.

Further in accordance with the present invention, the apparatus for fabricating a vertical deposition mask includes a tensioning device for tensioning a mask sheet to be fixed in place to a mask frame and a welder for attaching the mask frame to a circumference of the mask sheet. The tensioning device includes a plurality of clamps for supporting the mask sheet and a plurality of tensioners coupled to the clamps to apply tensile force to the clamps and to evenly fix in place the mask sheet by the clamps.

Tensile force measurers for measuring tensile force of the clamps may be further provided between the clamps and the tensioners. The tensile force measurers may include piezoelectric sensors for sensing a change in the tensile force of the clamps and electro-pneumatic regulators for controlling pneumatic pressure supplied to the tensioners when the measured tensile force of the clamps is different from a previously set value.

In addition, the vertical deposition mask fabricating apparatus may further include a mask sheet vertically transferring device for transferring an erect mask sheet to the tensioning device. The mask sheet vertically transferring device may include a first carrier for transferring the mask sheet. A first adsorbing member is positioned on a side of the first carrier to adsorb the mask sheet. A first guide rail is provided for moving the first carrier in a first direction toward the tensioning device. A first plate is coupled between the first carrier and the first guide rail to drop and raise the first carrier by 90 degrees. In addition, a second guide rail for moving the first carrier toward the tensioning device in a second direction orthogonal to the first direction may be further formed. At least one adsorbing hole for adsorbing the mask sheet may be formed on a front surface of the first adsorbing member.

In addition, the vertical deposition mask fabricating apparatus may further include a mask frame vertically transferring device for transferring the erect mask frame to the tensioning device. The mask frame vertically transferring device may include a second carrier for transferring the mask frame. A second adsorbing member is positioned on a side of the second carrier to adsorb the mask frame. A first guide rail is provided for moving the second carrier toward the tensioning device in a second direction opposing the first direction. A second plate is coupled between the second carrier and a first guide rail to drop and raise the second carrier by 90 degrees. A third guide rail for moving the second carrier toward the tensioning device in third direction orthogonal to the first direction and to the second direction may be further formed. The first guide rail may be formed of a guide in which a pair of grooves that run parallel with each other from a lower surface of a mask vertically transferring device to a lower surface of a mask frame vertically transferring device are formed. In addition, the second adsorbing member may include at least one adsorbing hole for adsorbing a glass substrate and a mask frame suction device for adsorbing a mask frame to a circumference of the glass substrate.

Further, at least one align mark for aligning a mask sheet and a mask frame may be formed in the glass substrate. A plurality of mask frame fixing blocks may be further provided in the second adsorbing member in order to prevent the mask frame adsorbed to the mask frame suction device from being detached. Cylinders that can protrude toward the outside of the mask fixing blocks may be provided in the mask frame fixing blocks. The welder may be a laser welder. The mask sheet vertically transferring device and the mask frame vertically transferring device may be coupled to each other by a coupling member to be moved in tandem.

BRIEF DESCRIPTION OF THE DRAWINGS

FIG. 4 is a perspective view illustrating an apparatus for fabricating a vertical deposition mask according to a second embodiment of the present invention.

FIGS. 5A, 5B, 5C, 5D, 5E, 5F, 5G and 5H are perspective views illustrating a method of fabricating a mask using the apparatus according to the second embodiment of the present invention.

DETAILED DESCRIPTION

Figure 1:
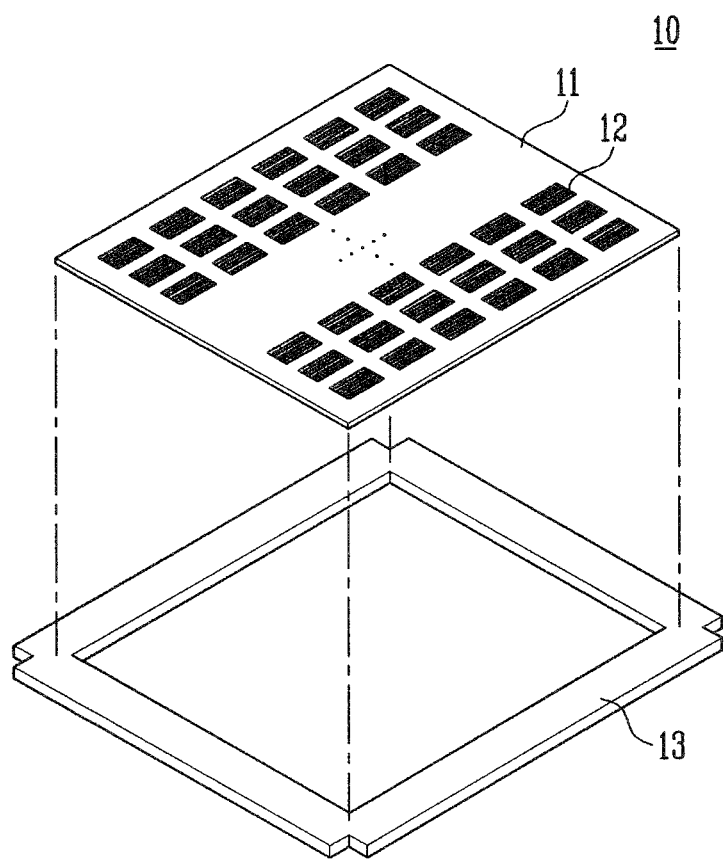
FIG. 1 is a perspective view illustrating a conventionally fabricated mask obtained by welding a mask sheet and a mask frame.
Figure 2:
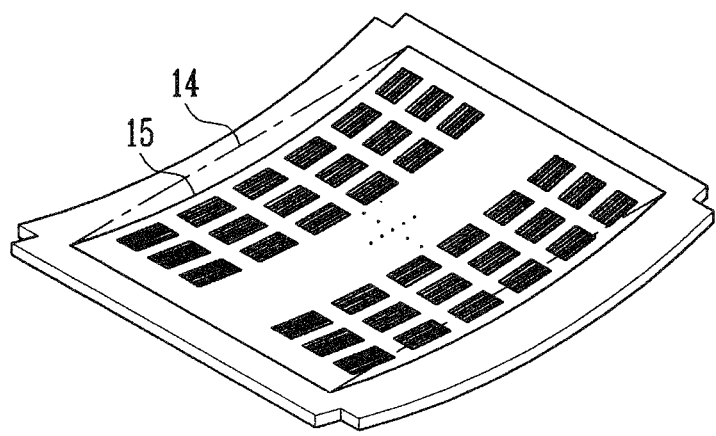
FIG. 2 illustrates a drooping of the conventionally fabricated mask.

Hereinafter, exemplary embodiments in accordance with the present invention will be described with reference to the accompanying drawings. When a first element is described as being coupled to a second element, the first element may be not only directly coupled to the second element but may also be indirectly coupled to the second element via a third element. Further, some of the elements that are not essential to the complete understanding of the invention are omitted for clarity. Also, like reference numerals refer to like elements throughout.

Figure 3:
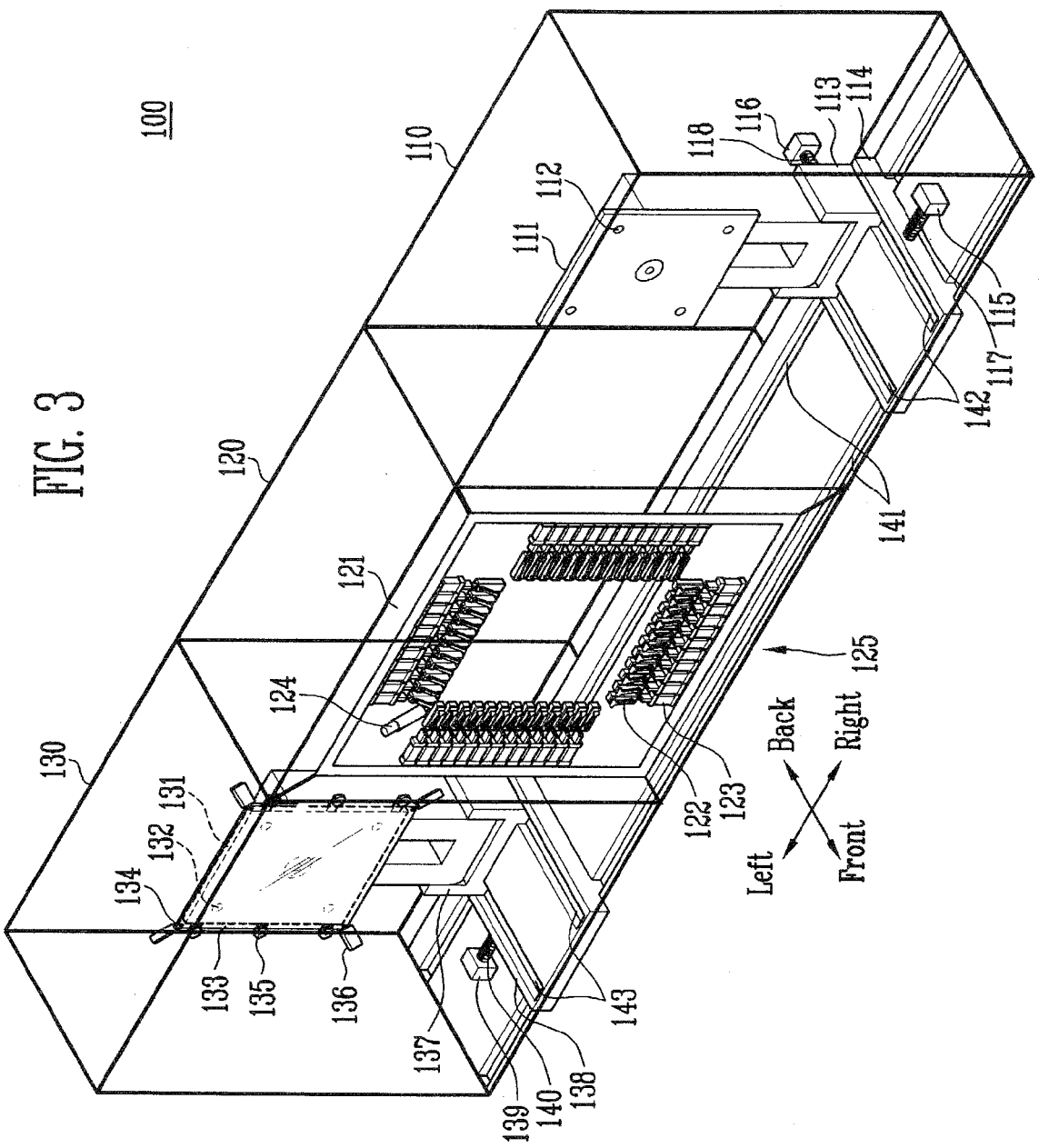
FIG. 3 is a perspective view illustrating an apparatus for fabricating a vertical deposition mask according to a first embodiment of the present invention.

Referring now to FIG. 3, a vertical deposition mask fabricating apparatus 100 according to a first embodiment of the present invention includes a mask sheet vertically transferring device for vertically transferring a mask sheet, a mask frame vertically transferring device for vertically transferring a mask frame corresponding to the mask sheet, and a mask fabricating device for welding the transferred mask sheet and mask frame to fabricate a mask.

The mask sheet vertically transferring device, the mask frame vertically transferring device, and the mask fabricating device are positioned in a mask vertically transferring region 110, a mask frame vertically transferring region 130, and a mask fabricating region 120, respectively, as illustrated in FIG. 3.

In the embodiment illustrated in FIG. 3, the mask fabricating region 120 is positioned between the mask sheet vertically transferring device 110 and the mask frame vertically transferring region 130 to receive the mask sheet and the mask frame vertically transferred from the respective transferring regions 110, 130 and to weld the mask sheet and the mask frame.

The mask fabricating device positioned in the mask fabricating region 120 includes a tensioning device 125 for attaching the mask sheet and the mask frame. The tensioning device 125 tenses the mask sheet to fix in place the mask sheet in order to prevent the mask sheet from being curved when the mask sheet and the mask frame are vertically deposited to fabricate a large area mask applied to a large area substrate without being curved.

The tensioning device 125 includes a plurality of clamps 122 for supporting the mask sheet and a plurality of tensioners 123 for applying tensile force to the clamps.

As illustrated in FIG. 3, the clamps 122 are vertically and horizontally formed with respect to a plane to fix in place the edges of the mask sheet.

In addition, the tensioners 123 coupled to the clamps, respectively, support the clamps 122 and apply the tensile force to the clamps 122 to fix in place the mask sheet to be even by the clamps 122. That is, the tensioners 123 apply the tensile force to the clamps 122 to tense the mask sheet fixed in place by the clamps 122 and to prevent the mask sheet from being curved.

The plurality of clamps 122 and tensioners 123 are formed on a frame 121 formed on the circumference of the tensioning device 125.

In addition, a welder 124 for welding the mask sheet and the mask frame is provided in the mask fabricating region 120. The welder 124 may be, for example, a laser welder.

The welder 124 welds the interface of the mask sheet tensed by the tensioning device 125 to be fixed in place and the mask frame corresponding to the mask sheet. The welding performed by the welder 124 may be seam welding whereby point welding or continuous welding is performed on the interface.

The mask sheet vertically transferring device for vertically transferring the mask sheet to the mask fabricating region 120 is positioned in the mask sheet vertically transferring region 110 and includes a first carrier 113 for transferring the mask sheet and a first guide rail 141 for facilitating the movement of the first carrier 113. The first carrier 113 and the first guide rail 141 are coupled to each other by a first plate 114.

As illustrated in FIG. 3, the first guide rail 141 for transferring the mask sheet from side to side is extended from the mask sheet vertical transferring region 110 to the mask frame vertical transferring region 130 through the mask fabricating region 120.

The first guide rail 141 may be formed of a guide in which a pair of grooves run parallel with each other from the lower end of the mask sheet vertical transferring region 110 to the lower end of the mask frame vertical transferring region 130.

In addition, a second guide rail 142 for moving the first carrier 113 back and forth is formed on the first plate 114 and may be formed of a guide in which a pair of grooves run parallel with each other from the front surface to the rear surface of the first plate 114 in which the first carrier 113 is provided.

In addition, a first adsorbing member 111 for adsorbing the mask sheet in order to vertically transfer the mask sheet is further provided on the upper side of the first carrier 113 and a plurality of adsorbing holes 112 are formed on the front surface of the first adsorbing member 111 so that the mask sheet can be adsorbed to the first adsorbing member 111. In addition, a first ball screw 117 and a first motor 115 are provided on the left or right side of the first plate 114 so that the first plate 114 can be moved from side to side and a second ball screw 118 and a second motor 116 are provided on the front surface or the rear surface of the first carrier 113 so that the first carrier 113 can be moved back and forth. That is, the first ball screw 117 is rotated by the first motor 115 to move the first plate 114 from side to side. In addition, the second ball screw 118 is rotated by the second motor 116 to move the first carrier 113 back and forth.

The mask frame vertically transferring device for vertically transferring the mask frame to the mask fabricating region 120 is positioned in the mask frame vertically transferring region 130 and includes a second carrier 137 for transferring the mask frame and the first guide rail 141 for facilitating the movement of the second carrier 137. The second carrier 137 and the first guide rail 141 are coupled to each other by a second plate 138.

Similar to that for the mask sheet vertically transferring region 110, the first guide rail 141 in the mask frame vertically transferring region 130 may be formed of a guide in which a pair of grooves run parallel with each other from the lower end of the mask sheet vertically transferring region 110 to the lower end of the mask frame vertically transferring region 130.

Likewise, a third guide rail 143 for moving the second carrier 137 back and forth is formed on the second plate 138. The third guide rail 143 may be formed of a guide in which a pair of grooves run parallel with each other from the front surface to the rear surface of the second plate 138 in which the second carrier 137 is provided.

In addition, a second adsorbing member 131 for adsorbing the mask frame in order to vertically transfer the mask frame is further provided on the upper side of the second carrier 137 and a plurality of adsorbing holes 132 are formed on the front surface of the second adsorbing member 131 to adsorb a glass substrate 133. The glass substrate 133 is provided to align the mask sheet and the mask frame. At least two align marks 134 may be formed at the edges of the glass substrate 133 to align the mask sheet and the mask frame. A mask frame suction device 135 is further formed on the outermost circumference of the second adsorbing member 131 to attach the mask frame to the circumference of the glass substrate 133. In addition, at least three mask frame fixing blocks 136 are further provided at the edges of the second adsorbing member 131 in order to prevent the mask frame adsorbed to the mask frame suction device 135 from being detached. According to the embodiment illustrated in FIG. 3, for convenience sake, the mask frame fixing blocks 136 are provided at all of the edges of the second adsorbing member 131.

When the mask frame is adsorbed onto the mask frame suction device 135, a cylinder (not shown) provided in the mask frame fixing block 136 protrudes to the outside so that it is possible to prevent the mask frame from detaching from the mask frame suction device 135 or to prevent the mask frame from moving. That is, the mask frame fixing block 136 doubly supports the mask frame adsorbed to the mask frame suction device 135 to stably support the mask frame.

In addition, a third ball screw 140 and a third motor 139 are provided on the left or right side of the second plate 138 so that the second carrier 137 can be moved from side to side. In addition, a fourth ball screw (not shown) and a fourth motor (not shown) are provided on the front or rear surface of the second carrier 137 so that the second carrier 137 can be moved back and forth, much like that for the mask sheet vertically transferring region 110.

FIG. 4 is a perspective view illustrating an apparatus for fabricating a vertical deposition mask according to a second embodiment of the present invention.

Most of the structure of the apparatus for fabricating a vertical deposition mask according to the second embodiment illustrated in FIG. 4 is the same as the structure of the apparatus for fabricating a vertical deposition mask according to the first embodiment illustrated in FIG. 3. As such, description of the same components as those of FIG. 3 will be omitted.

However, a difference between the structure of the apparatus for fabricating a vertical deposition mask according to the second embodiment illustrated in FIG. 4 and the structure of the apparatus for fabricating a vertical deposition mask according to the first embodiment illustrated in FIG. 3 lies in that the first plate 214 in a mask sheet vertically transferring region 210 and a second plate 238 in a mask frame vertically transferring region 230 are coupled to each other by a coupling member 244 so that movement from side to side is performed in tandem.

That is, a first carrier 213 coupled to the first plate 214 and a second carrier 237 coupled to the second plate 238 are separated from each other by a predetermined distance to be moved in tandem.

For example, when the mask sheet is transferred to a mask fabricating region 220 by the first carrier 213, at the same time, the second carrier 237 is positioned in the mask frame vertically transferring region 230. To the contrary, when the mask frame is transferred to the mask fabricating region 220 by the second carrier 237, at the same time, the first carrier 213 is positioned in the mask sheet vertically transferring region 210.

In the case of FIG. 4, the mask frame is transferred to the mask fabricating region 220 by the second carrier 238 and the first carrier 213 is positioned in the mask sheet vertically transferring region 210.

Therefore, since the first plate 214 and the second plate 238 are interlocked with each other to be moved, the first plate 214 and the second plate 238 can be moved in tandem by one motor.

That is, according to an embodiment, as illustrated in FIG. 4, the first plate 214 and the second plate 238 can be moved in tandem from side to side by a first motor 215 and a first ball screw 217 formed on the right side of the first plate 214.

Therefore, since fewer motors are used in the first embodiment than in the second embodiment, it is possible to simplify the vertical deposition mask fabricating apparatus.

FIGS. 5A to 5H are perspective views illustrating a method of fabricating a mask using the apparatus for fabricating a vertical deposition mask according to the second embodiment of the present invention. FIG. 6 is a sectional view of the mask sheet and the mask frame attached to each other.

Figure 5A:
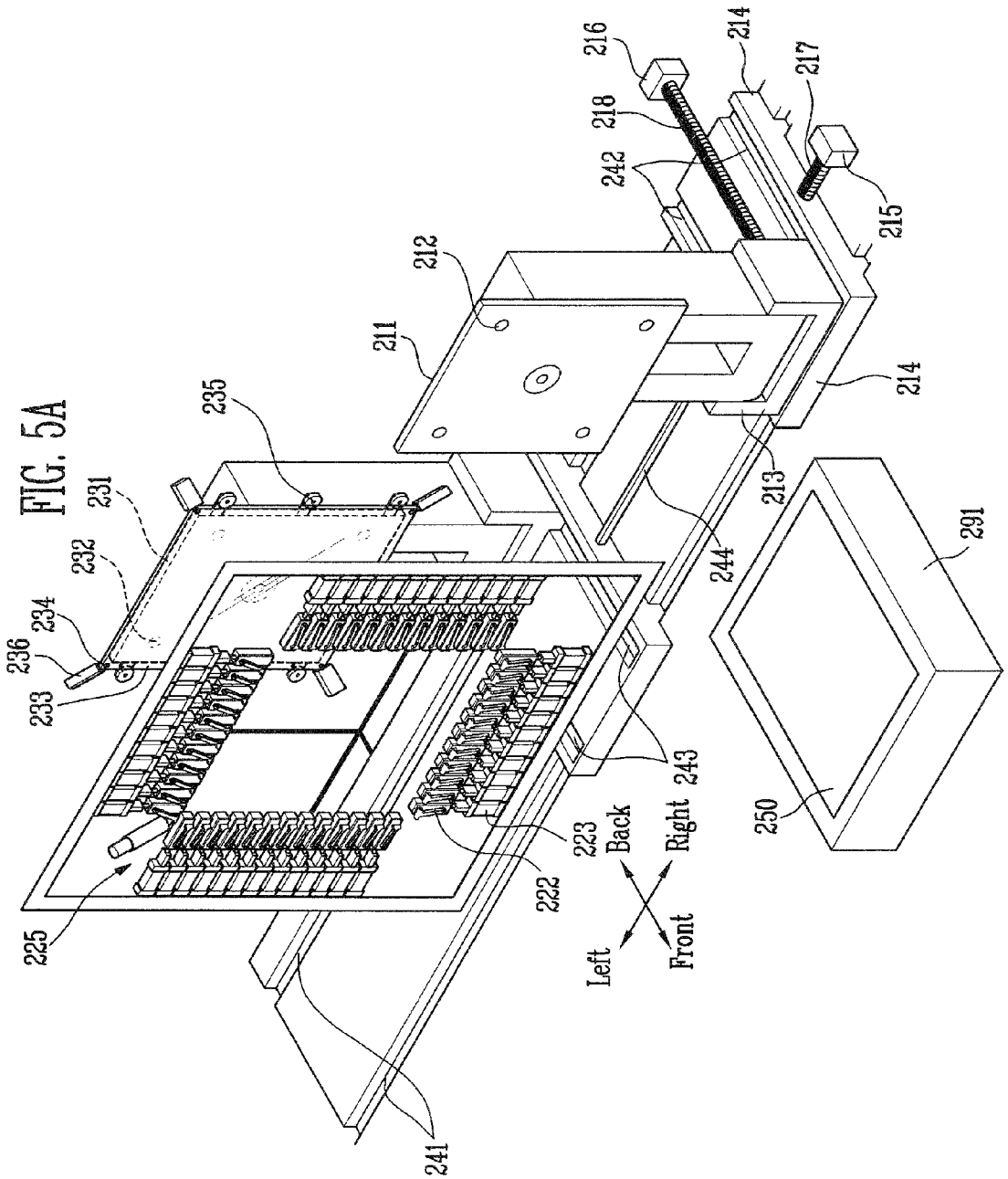
Figure 6:
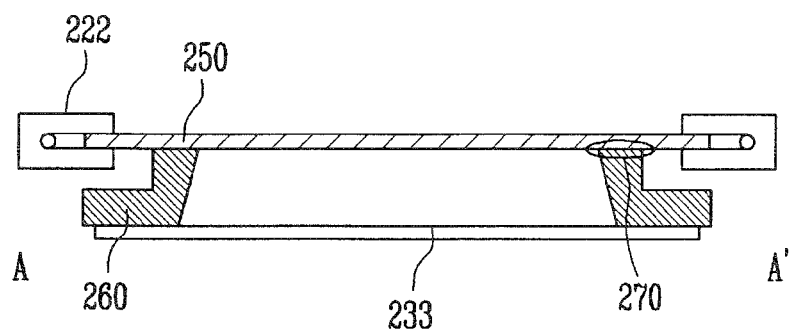
FIG. 6 is a sectional view of the mask sheet and the mask frame attached to each other.

First, referring to FIG. 5A, in order to transfer a mask sheet 250 to the inside of a mask fabricating region, the first carrier 213 including a first adsorbing member 211 is positioned on the front of a mask sheet vertically transferring region and is moved to a first table 291 on whose top surface the mask sheet 250 is positioned. In order to move the first carrier 213 including the first adsorbing member 211 to the first table 291, a first motor 215 is used to drive the first ball screw 217 so that the first plate 214 coupled to the first carrier 213 is moved to the mask sheet vertically transferring region through the first guide rail 241.

Then, a second ball screw 218 is driven by a second motor 216 so that the first carrier 213 is moved to the first table 291 through a second guide rail 242.

Figure 5B:
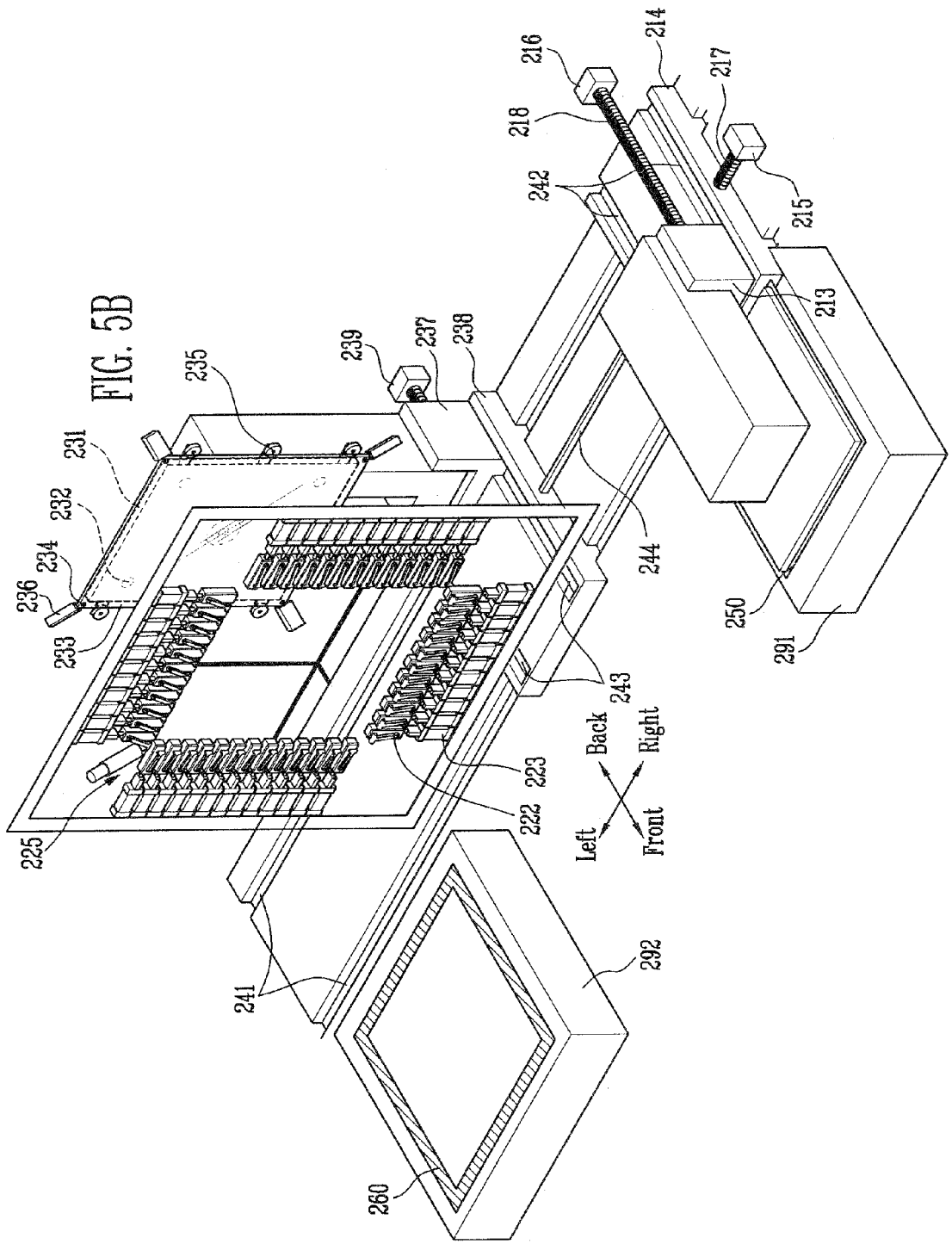

Then, referring to FIG. 5B, in order to adsorb the mask sheet 250 positioned on the top surface of the first table 291 to the first adsorbing member 211, the first carrier 213 including the first adsorbing member 211 is dropped toward the first table 291 by 90 degrees.

The first plate 214 coupled to the first carrier 213 drops and raises the first carrier 213 by 90 degrees.

Figure 5C:
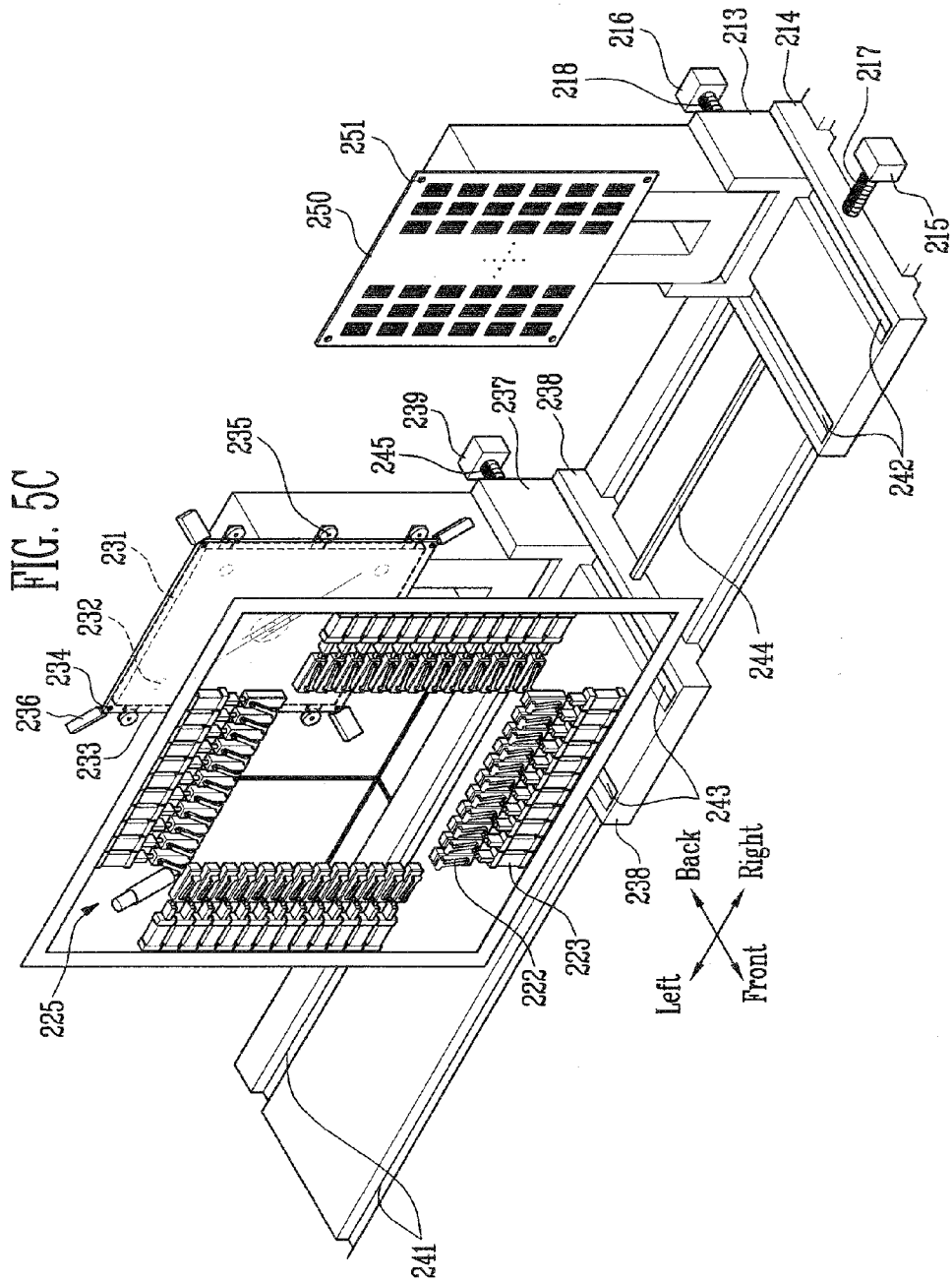

Then, referring to FIG. 5C, after vacuum-suctioning the mask sheet 250 to the first adsorbing member 211 using (as seen in FIG. 5A) a plurality of adsorbing devices 212 formed on the front surface of the first adsorbing member 211, the first carrier 213 is again raised by 90 degrees.

When the mask sheet 250 is adsorbed to the first adsorbing member 211 and the first carrier 213 is raised by 90 degrees, the first carrier 213 is moved to the rear of the mask sheet vertically transferring region 210 in order to transfer the first carrier 213 to which the mask sheet 250 is adsorbed to a tensioning device 225 positioned in a mask fabricating region.

In order to move the first carrier 213 to which the mask sheet 250 is adsorbed to the surface of the mask sheet vertically transferring region 210, the second ball screw 218 is driven by the second motor 216 to move the first carrier 213 to the rear surface of the first plate 214 through the second guide rail 242.

Figure 5D:
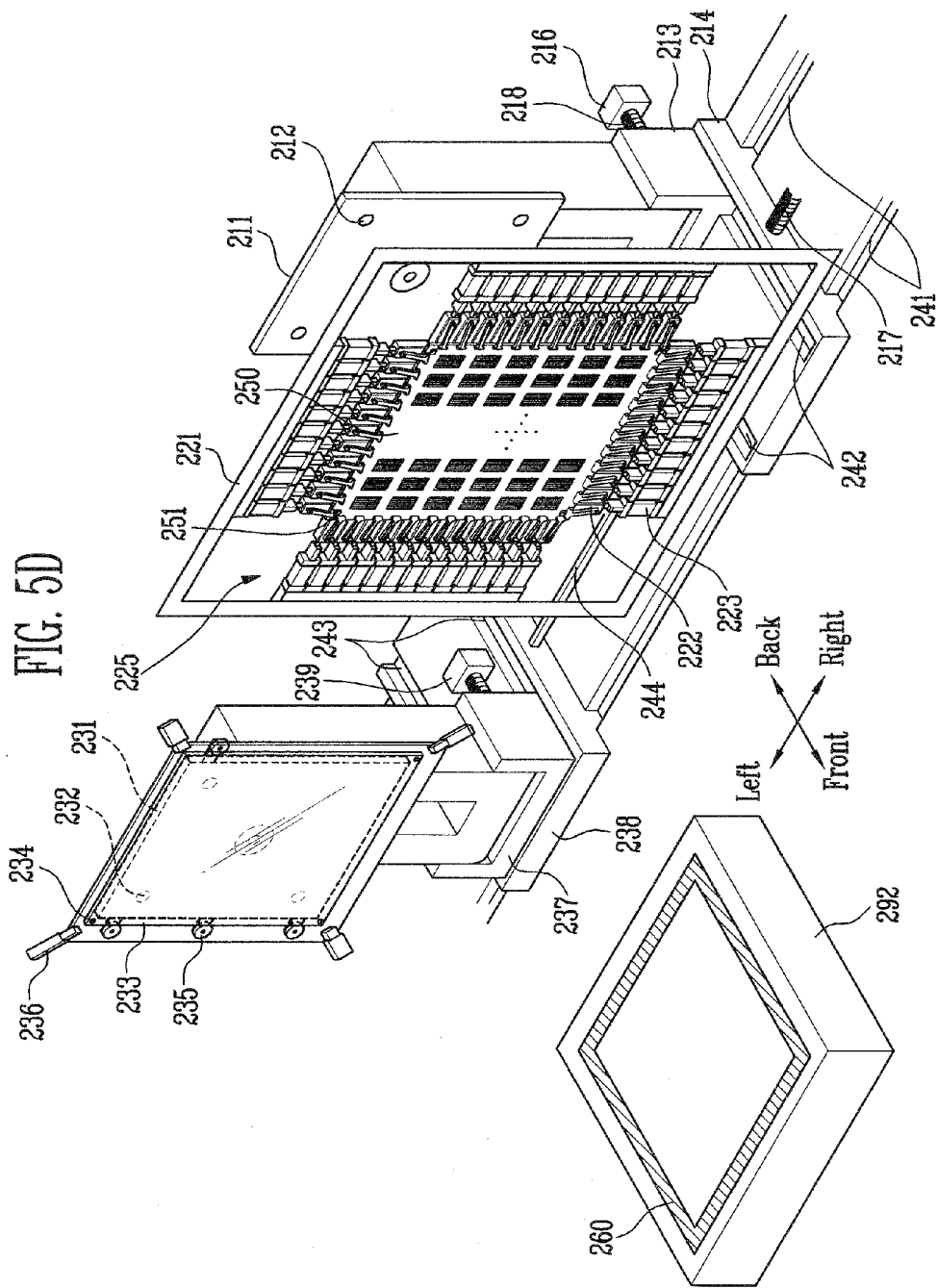

Then, referring to FIG. 5D, the first carrier 213 to which the mask sheet 250 is adsorbed is transferred to the tensioning device 225 positioned in the mask fabricating region.

The first ball screw 217 is driven by the first motor 215 to move the first plate 214 along the first guide rail 241. Therefore, the mask sheet 250 can be positioned at the rear surface of the tensioning device 225 in which a plurality of clamps 222 are formed. Then, the second ball screw 218 is driven by the second motor 216 to position the mask sheet 250 adsorbed to the first adsorbing member 211 included in the first carrier 213 between the plurality of clamps 222 through the second guide rail 242.

Then, the tensioning device 225 including the plurality of clamps 222 is moved from the circumference of a frame 221 to the inside of the frame 221 by a cylinder formed on the rear surface of the frame 221. When the plurality of clamps 222 are positioned at the edges of the mask sheet 250 by the cylinder, the mask sheet 250 is positioned between the plurality of clamps 222 to fix in place the mask sheet 250.

When the mask sheet 250 is fixed in place by the plurality of clamps 222, the mask sheet 250 is detached from the first adsorbing member 211 to which the mask sheet 250 was adsorbed.

Then, the mask sheet 250 fixed in place by the plurality of clamps 222 is tensed toward the frame 221 using tensioners 223. As such, the mask sheet 250 can be evenly fixed in place the clamps 222.

When the mask sheet 250 is fixed in place by the plurality of clamps 222, the first carrier 213 is moved to the rear surface of the tensioning device 225 using the second motor 216, and the second carrier 237 including a second adsorbing member 231 is moved toward a second table 292 on which a mask frame 260 is settled using a third motor 239.

Figure 5E:
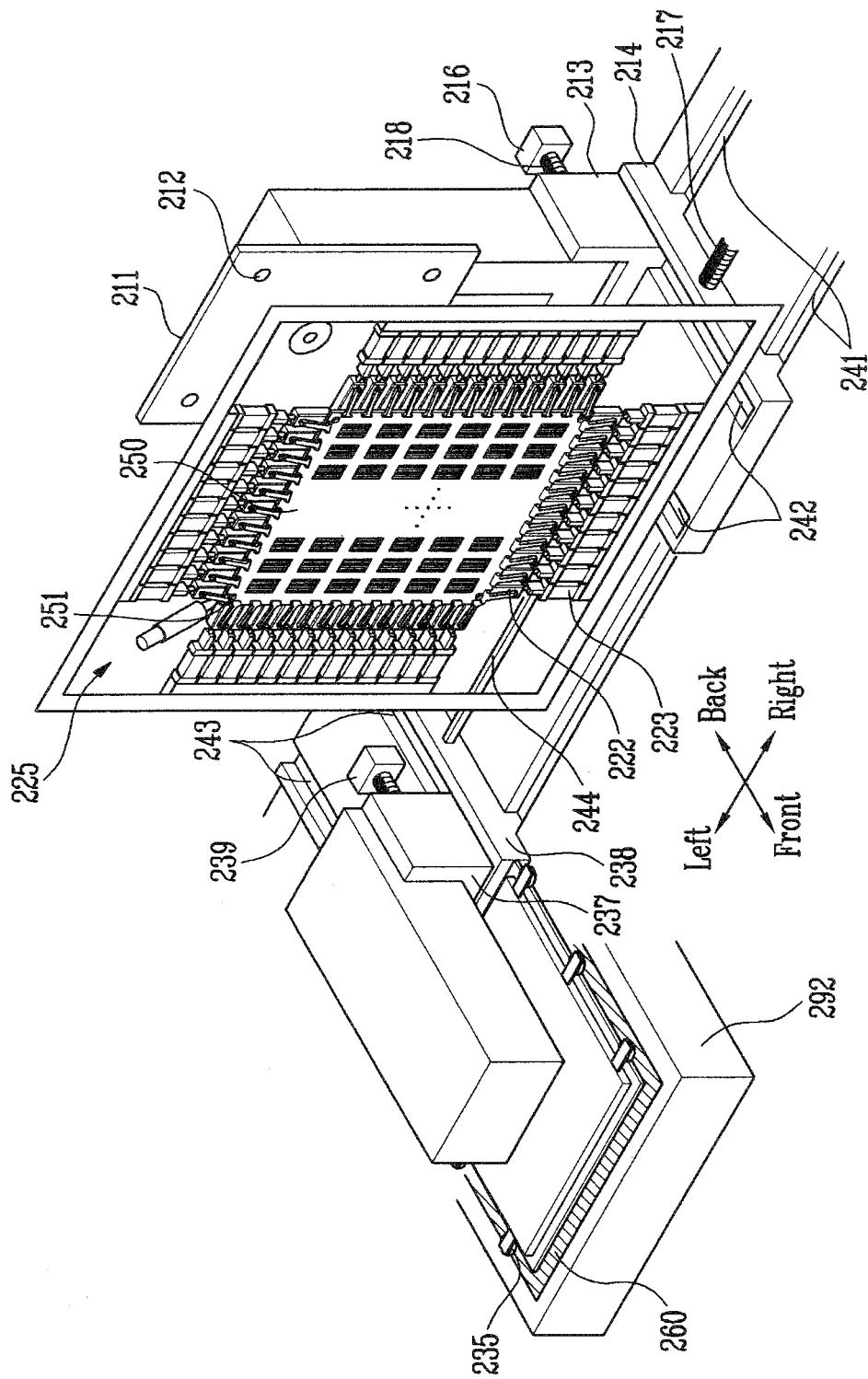

Then, referring to FIG. 5E, the second carrier 237 including the second adsorbing member 231 is dropped to the second table 292 on whose upper side the mask frame 260 is settled by 90 degrees in order to adsorb the mask frame 260 to the second adsorbing member 231.

The second plate 238 coupled to the second carrier 237 drops and raises the second carrier 237 by 90 degrees.

Now, referring to FIG. 5F, after the second adsorbing member 231 is dropped by 90 degrees, when the mask frame 260 is adsorbed to the mask frame suction device 235, the second carrier 237 is again raised by 90 degrees.

Then, the mask frame 260 is prevented from being detached from the mask frame suction device 235 or from being moved using a plurality of mask frame fixing blocks 236 formed on the circumference of the second adsorbing member 231. That is, when the mask frame 260 is adsorbed to the mask frame suction device 235, cylinders provided in the mask frame fixing blocks 236 protrude to the outside of the mask frame fixing blocks 236 so that the mask frame 260 is prevented from being detached from the mask frame suction device 235 or from being moved.

When the mask frame 260 is adsorbed to the second adsorbing member 231 and the second carrier 237 is raised by 90 degrees, the second carrier 237 to which the mask frame 260 is adsorbed is moved to the rear of the mask frame vertically transferring region 230.

In order to move the second carrier 237 to which the mask frame 260 is adsorbed to the rear of the mask frame vertically transferring region 230, the third ball screw 245 is driven by the third motor 239 to move the second carrier 237 along a third guide rail 243.

Then, referring to FIG. 5G, the second carrier 237 is moved to the rear surfaces of the clamps 222 included in the tensioning device 225 using the first motor 215. The first carrier 213 including the first adsorbing member 211 is interlocked with the second carrier 237 to be moved to the mask sheet vertically transferring region the moment when the second carrier 237 is moved.

Then, the second carrier 237 is moved to the tensioning device 225 by the third motor 239 to couple the mask sheet 250 fixed in place by the plurality of clamps 222 and the mask frame 260 adsorbed by the second adsorbing member 231.

The mask frame 260 has a step difference to be prevented from being coupled to the clamps 222 for supporting the mask sheet 250. That is, according to the present invention, as illustrated in FIG. 6, the interface 270 of the mask frame 260 coupled to the mask sheet 250 fixed in place by the clamps 222 is formed in the clamps 222 to prevent the mask sheet 250 from being separated from the mask frame 260 by the clamps 222.

In addition, align marks 234 formed on the glass substrate 233 provided on the rear surface of the mask frame 260 are positioned in the center of align holes 251 formed in the mask sheet 250 in order to easily align the mask frame 260 and the mask sheet 250.

In addition, a magnet (not shown) is provided on the front surface of the mask sheet 250 in order to completely remove a space between the mask sheet 250 and the mask frame 260. Magnetic force is generated between the mask frame 260 formed of a metal and a magnet to remove the space between the mask sheet 250 and the mask frame 260.

When the mask sheet 250 and the mask frame 260 are aligned by the above-described method, the space between the mask sheet 250 and the mask frame 260 is removed to weld the mask sheet 250 and the mask frame 260 by a welder 224.

The welding is performed on the interface 270 of the mask sheet 250 and the mask frame 260 and can be point welding. The point welding can be performed from the interface 270 adjacent to the mask sheet 250 to the interface 270 adjacent to the mask frame 260 (as illustrated by the arrow in FIG. 5G) in order to minimize changes in the mask frame 260 and the mask sheet 250 that are caused by thermal expansion generated during the welding.

Figure 5H:
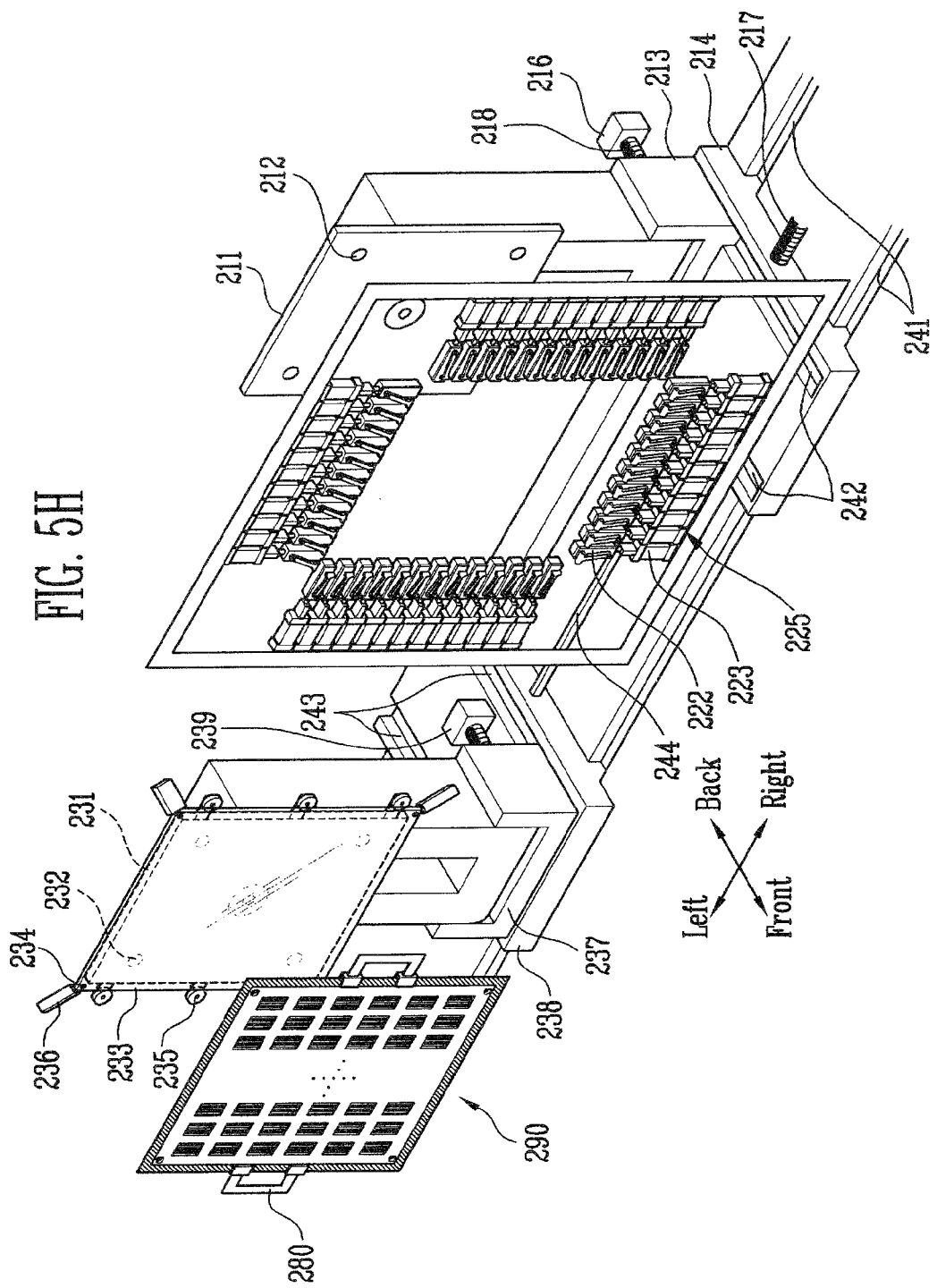

Referring to FIG. 5H, a resultant mask 290 in which the mask sheet 250 and the mask frame 260 are integrated with each other is fabricated by the above-described method. In addition, when the mask sheet 250 and the mask frame 260 are welded to each other, the cylinders provided in the mask frame fixing blocks 236 are protruded to the outside to prevent the mask 290 from deviating from the second adsorbing member 231.

Finally, when the mask sheet 250 and the mask frame 260 are welded to each other to fabricate the mask 290, the mask sheet 250 is detached from the clamps 222 to which the mask sheet 250 is fixed in place. Then, the second carrier 237 is moved to the rear surface of the tensioning device 225 by the third motor 239.

Then, the second carrier 237 is moved to the mask frame vertically transferring region 230. In addition, the second carrier 237 is transferred to the front of the mask frame vertically transferring region by the third motor 239. Then, when the second carrier 237 is moved to the mask frame vertically transferring region 230, the cylinders that protrude from the mask frame fixing blocks 236 are moved to the insides of the mask frame fixing blocks 236.

Next, the mask 290 is detached from the mask frame suction device 235 by a frame loader 280 provided in the lower end of the mask frame vertically transferring region 230. Finally, the mask 290 is transferred away from the vertical deposition mask fabricating apparatus.

Figure 7:
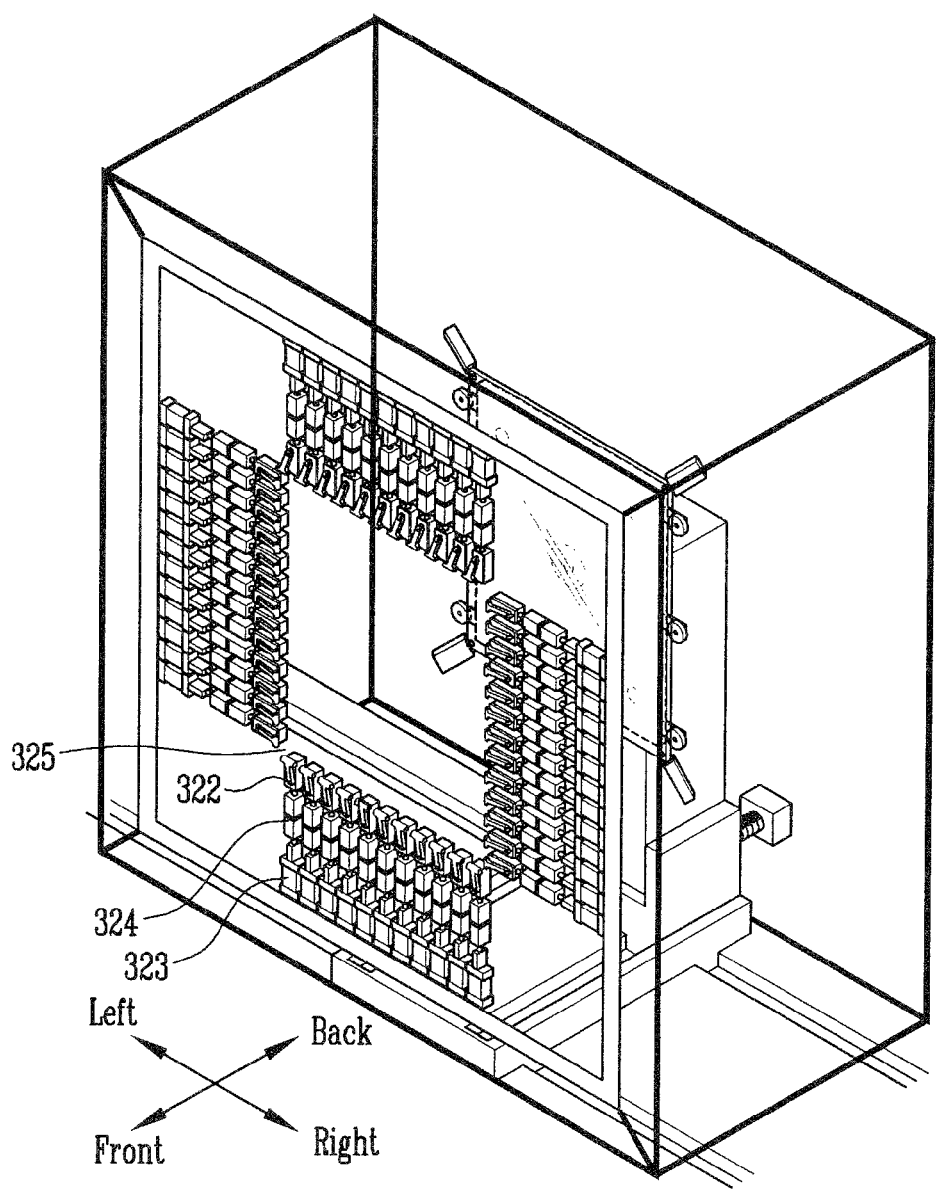
FIG. 7 is a perspective view illustrating an apparatus for fabricating a vertical deposition mask according to a third embodiment of the present invention.

FIG. 7 is a perspective view illustrating an apparatus for fabricating a vertical deposition mask according to a third embodiment of the present invention.

The embodiment illustrated in FIG. 7 is the same as the first and second embodiments described with reference to FIGS. 3 and 4 except for the tensioning device having a modified structure. Therefore, for convenience sake, description of the same components as those of FIGS. 3 and 4 will be omitted.

Referring to FIG. 7, the tensioning device 325 of the vertical deposition mask fabricating apparatus according to the third embodiment of the present invention further includes tensile force measurers 324 for measuring tensile force of clamps 322 between the plurality of clamps 322 for supporting a mask sheet and tensioners 323.

The tensile force measurers 324 measure tensile force by pneumatic pressure supplied from the tensioners 323 to measure the tensile force transmitted to the clamps 322.

The tensile force measurers 324 include piezoelectric sensors (not shown) for sensing a change in the tensile force of the clamps 322 and electro-pneumatic regulators (not shown) for controlling pneumatic pressure supplied to the tensioners 323 when the measured tensile force of the clamps is different from a previously set value.

That is, when the tensile force of the clamps 322 changes, the piezoelectric sensors built in the tensile force measurers 324 cause a change so that the magnitude of the tensile force can be grasped through generated current.

When the tensile force of the clamps 322 that is measured by the tensile force measurers 324 is different from a set value, the pneumatic pressure supplied from the electro-pneumatic regulators to the tensioners 323 is controlled so that the tensile force of the clamps 322 can be controlled.

For example, when the tensile force of the clamps 322 is smaller than the set tensile force, the pneumatic pressure supplied to the tensioners 323 is increased to increase the tensile force. When the tensile force of the clamps 322 is larger than the set tensile force, the pneumatic pressure supplied to the tensioners 323 is reduced to reduce the tensile force.

It is well-known to those skilled in the art that the masks fabricated by the above-described vertical deposition mask fabricating apparatuses according to the first to third embodiments can be applied to an organic light emitting display (OLED), liquid crystal display (LCD), a field emission display (FED), a plasma display panel (PDP), an electro-luminescent display (ELD), and a vacuum fluorescent display (VFD).

According to the present invention, the mask sheet and the mask frame are fabricated by the vertical deposition apparatus so that the mask sheet and the mask frame can be prevented from drooping.

In addition, when the mask sheet and the mask frame are vertically deposited, in order to prevent the mask sheet from being curved, the mask sheet is tensed to be fixed in place so that the large area mask applied to the large area substrate can be fabricated without being curved.

Furthermore, when thin films are formed on a substrate using the mask fabricated according to the present invention, it is possible to improve productivity.

Although exemplary embodiments of the present invention have been shown and described, it would be appreciated by those skilled in the art that changes might be made in these embodiments without departing from the principles and spirit of the invention, the scope of which is defined in the claims and their equivalents.

What is claimed is:

1. An apparatus for fabricating a vertical deposition mask, comprising:
 a tensioning device for tensioning a mask sheet, the tensioning device comprising:
  a plurality of clamps configured to vertically support the mask sheet; and
  a plurality of tensioners coupled to the clamps for applying tensile force to the clamps and for evenly fixing in place the mask sheet by the clamps;
 a welder for attaching a mask frame to a circumference of the mask sheet; and
 a mask sheet vertically transferring device for transferring an erect mask sheet to the tensioning device, wherein the mask sheet vertically transferring device comprises:
  a carrier for transferring the mask sheet; and
  a plate for dropping and raising the carrier by 90 degrees.

2. The vertical deposition mask fabricating apparatus as claimed in claim 1, further comprising tensile force measurers between the clamps and the tensioners for measuring tensile force of the clamps.

3. The vertical deposition mask fabricating apparatus as claimed in claim 2, wherein the tensile force measurers comprise:
 piezoelectric sensors for sensing a change in the tensile force of the clamps; and
 electro-pneumatic regulators for controlling pneumatic pressure supplied to the tensioners when a measured tensile force of the clamps is different from a previously set value.

4. An apparatus for fabricating a vertical deposition mask, comprising:
 a tensioning device for tensioning a mask sheet, the tensioning device comprising:
  a plurality of clamps for supporting the mask sheet; and
  a plurality of tensioners coupled to the clamps for applying tensile force to the clamps and for evenly fixing in place the mask sheet by the clamps;
 a welder for attaching a mask frame to a circumference of the mask sheet; and
 a mask sheet vertically transferring device for transferring an erect mask sheet to the tensioning device,
  wherein the mask sheet vertically transferring device comprises:
   a first carrier for transferring the mask sheet;

a first adsorbing member positioned on a side of the first carrier to adsorb the mask sheet;

a first guide rail for moving the first carrier in a first direction toward the tensioning device; and a first plate coupled between the first carrier and the first guide rail for dropping and raising the first carrier by 90 degrees.

5. The vertical deposition mask fabricating apparatus as claimed in claim 4, wherein the mask sheet vertically transferring device further comprises a second guide rail for moving the first carrier toward the tensioning device in a second direction orthogonal to the first direction.

6. The vertical deposition mask fabricating apparatus as claimed in claim 4, wherein at least one adsorbing hole for adsorbing the mask sheet is on a surface of the first adsorbing member.

7. The vertical deposition mask fabricating apparatus as claimed in claim 4, further comprising a coupling member for coupling the mask sheet vertically transferring device and a mask frame vertically transferring device to each other and for moving in tandem the mask sheet vertically transferring device and the mask frame vertically transferring device.

8. An apparatus for fabricating a vertical deposition mask, comprising:
   a tensioning device for tensioning a mask sheet, the tensioning device comprising:
      a plurality of clamps for supporting the mask sheet; and
      a plurality of tensioners coupled to the clamps for applying tensile force to the clamps and for evenly fixing in place the mask sheet by the clamps;
   a welder for attaching a mask frame to a circumference of the mask sheet; and
   a mask frame vertically transferring device for transferring the erect mask frame to the tensioning device,
   wherein the mask frame vertically transferring device comprises:
      a second carrier for transferring the mask frame;
      a second adsorbing member positioned on a side of the second carrier to adsorb the mask frame;
      a first guide rail for moving the second carrier toward the tensioning device in a second direction opposing the first direction; and
      a second plate coupled between the second carrier and a first guide rail for dropping and raising the second carrier by 90 degrees.

9. The vertical deposition mask fabricating apparatus as claimed in claim 8, wherein the mask frame vertically transferring device further comprises a third guide rail for moving the second carrier toward the tensioning device in third direction orthogonal to the first direction and to the second direction.

10. The vertical deposition mask fabricating apparatus as claimed in claim 8, wherein the first guide rail is a guide having a pair of grooves running parallel with each other from a lower surface of a mask vertically transferring device to a lower surface of a mask frame vertically transferring device.

11. The vertical deposition mask fabricating apparatus as claimed in claim 8, wherein the second adsorbing member comprises:

at least one adsorbing hole for adsorbing a glass substrate; and a mask frame suction device for adsorbing a mask frame to a circumference of the glass substrate.

12. The vertical deposition mask fabricating apparatus as claimed in claim 11, wherein at least one align mark for aligning a mask sheet and a mask frame is on the glass substrate.

13. The vertical deposition mask fabricating apparatus as claimed in claim 8, further comprising a coupling member for coupling the mask sheet vertically transferring device and a mask frame vertically transferring device to each other and for moving in tandem the mask sheet vertically transferring device and the mask frame vertically transferring device.

14. The vertical deposition mask fabricating apparatus as claimed in claim 11, a plurality of mask frame fixing blocks are further provided in the second adsorbing member for preventing the mask frame adsorbed to the mask frame suction device from being detached.

15. The vertical deposition mask fabricating apparatus as claimed in claim 14, wherein cylinders protrudable toward an outside of the mask fixing blocks are provided in the mask frame fixing blocks.

16. The vertical deposition mask fabricating apparatus as claimed in claim 1, wherein the welder is a laser welder.

17. An apparatus for fabricating a vertical deposition mask, comprising:
   a tensioning device for tensioning a mask sheet;
   a mask sheet vertically transferring device for transferring an erect mask sheet to the tensioning device;
   a mask frame vertically transferring device for transferring an erect mask frame to the tensioning device; and
   a welder for coupling the mask sheet and a mask frame attached to a circumference of the mask sheet to each other,
   the tensioning device comprising:
      a plurality of clamps for supporting the mask sheet; and
      a plurality of tensioners coupled to the clamps for applying tensile force to the clamps and for evenly fixing in place the mask sheet by the clamps,
   the mask sheet vertically transferring device comprising:
      a first carrier for transferring the mask sheet;
      a first adsorbing member positioned on a side of the first carrier to adsorb the mask sheet;
      a first guide rail for moving the first carrier toward the tensioning device in a first direction; and
      a first plate coupled between the first carrier and the first guide rail to drop and raise the first carrier by 90 degrees, and
   the mask frame vertically transferring device comprising:
      a second carrier for transferring the mask frame;
      a second adsorbing member positioned on a side of the second carrier to adsorb the mask frame;
      a first guide rail for moving the second carrier toward the tensioning device in a second direction opposing the first direction; and
      a second plate coupled between the second carrier and a first guide rail for dropping and raising the second carrier by 90 degrees.

* * * * *